(12) United States Patent
Tsai et al.

(10) Patent No.: US 7,994,016 B2
(45) Date of Patent: Aug. 9, 2011

(54) METHOD FOR OBTAINING QUALITY ULTRA-SHALLOW DOPED REGIONS AND DEVICE HAVING SAME

(75) Inventors: Chun-Hsiung Tsai, Hsin-Chu (TW); Chun-Feng Nieh, Hsin-Chu (TW); Da-Wen Lin, Hsin-Chu (TW); Chien-Tai Chan, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/616,406

(22) Filed: Nov. 11, 2009

(65) Prior Publication Data
US 2011/0111571 A1    May 12, 2011

(51) Int. Cl.
*H01L 21/336*  (2006.01)
(52) U.S. Cl. ........................ 438/305; 257/344
(58) Field of Classification Search .......... 438/305
See application file for complete search history.

(56) References Cited

U.S. PATENT DOCUMENTS

| | | | |
|---|---|---|---|
| 6,093,610 A | 7/2000 | Rodder | |
| 6,939,769 B2 | 9/2005 | Oh | |
| 7,071,069 B2 | 7/2006 | Tan et al. | |
| 7,138,322 B2 | 11/2006 | Noda | |
| 7,169,675 B2 | 1/2007 | Tan et al. | |
| 7,348,264 B2 | 3/2008 | Sasaki et al. | |
| 7,407,874 B2* | 8/2008 | Sasaki et al. | 438/513 |
| 7,408,233 B2 | 8/2008 | Yamazaki et al. | |
| 7,482,255 B2 | 1/2009 | Graoui et al. | |
| 7,501,322 B2 | 3/2009 | Ito et al. | |
| 7,553,763 B2 | 6/2009 | Hsiao et al. | |
| 2008/0258178 A1* | 10/2008 | Wang et al. | 257/228 |

OTHER PUBLICATIONS

Bunji Mizuno et al., "Aiming for the Best Matching Between Ultra-Shallow Doping and Milli-to Femto-Second Activation", pp. 1-41; RTP conference 2007.

* cited by examiner

*Primary Examiner* — N Drew Richards
*Assistant Examiner* — Robert Carpenter
(74) *Attorney, Agent, or Firm* — Duane Morris LLP; Joseph A. Powers

(57) ABSTRACT

A method of forming ultra-shallow p-type lightly doped drain (LDD) regions of a PMOS transistor in a surface of a substrate includes the steps of providing a gaseous mixture of an inert gas, a boron-containing source, and an optional carbon-containing source, wherein the concentration of the gaseous mixture is at least 99.5% dilute with the inert gas and the optional carbon-containing source, if present, forming the gaseous mixture into a plasma, and forming the LDD regions, wherein the forming step includes plasma-doping the boron into the substrate using the plasma. N-type pocket regions are formed in the substrate underneath and adjacent to the LDD regions, wherein for a PMOS transistor having a threshold voltage of 100 mV, the n-type pocket regions include phosphorous impurities at a dopant concentration of less than $6.0 \times 10^{18}$ atoms/cm$^3$ or a proportionately lower/higher dopant concentration for a lower/higher threshold voltage.

14 Claims, 3 Drawing Sheets

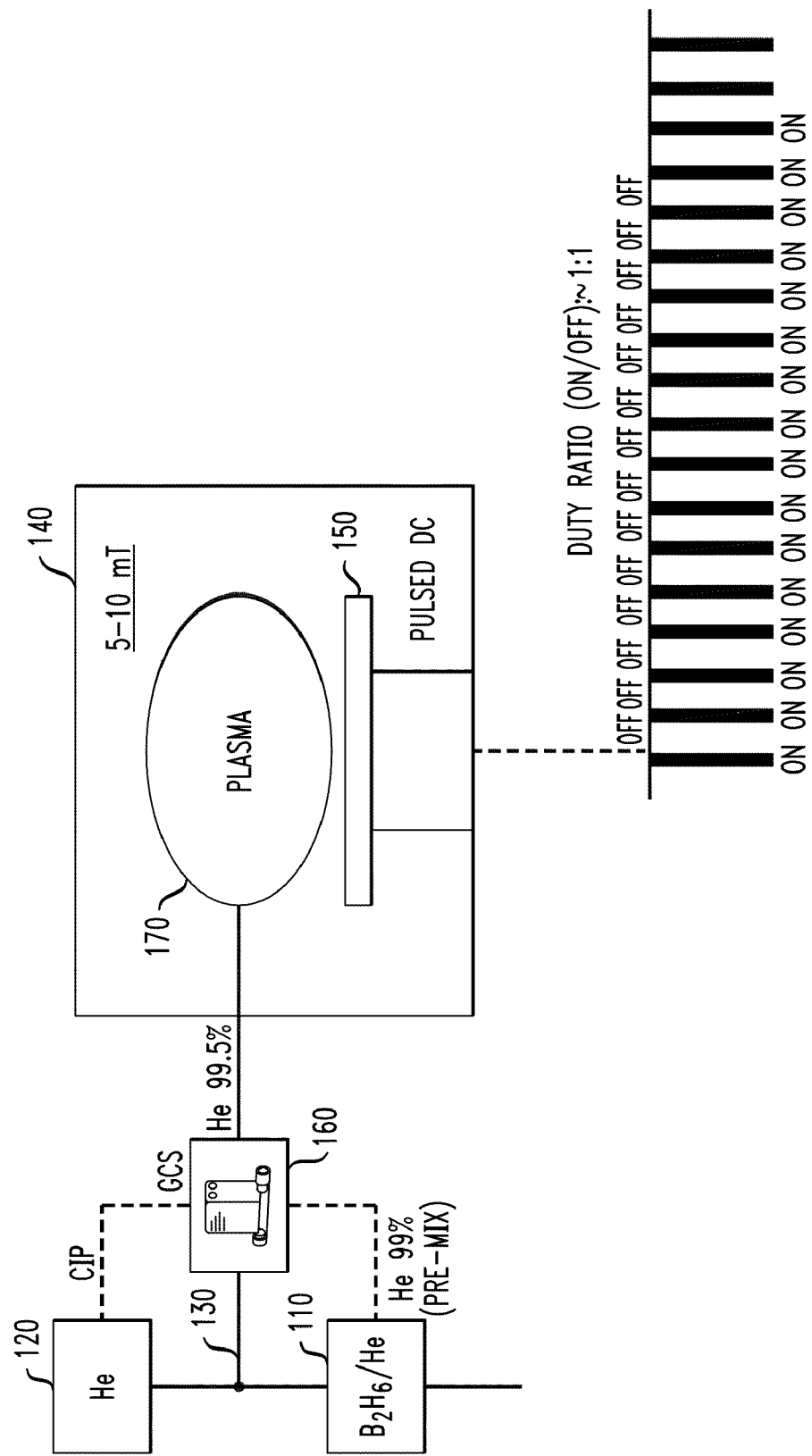

US 7,994,016 B2

METHOD FOR OBTAINING QUALITY ULTRA-SHALLOW DOPED REGIONS AND DEVICE HAVING SAME

FIELD OF THE INVENTION

The present invention relates to a method of ion implantation for forming ultra shallow junctions for MOS devices with highly active dopants.

BACKGROUND OF THE INVENTION

When a shallow doped layer or region, such as a boron layer, is formed in a semiconductor substrate by ion implantation, the junction depth is not just dependent on the ion implant energy but can also depend on channeling and phenomena such as transient enhanced diffusion (TED) when the implanted ions migrate through the crystal lattice during subsequent thermal processing. Current techniques for forming ultra-shallow doped regions, such as PLDD regions in CMOS devices, use pre-amorphisation techniques to amorphise the semiconductor substrate (i.e., turn a portion of the crystalline silicon substrate into amorphous silicon) by, for example, ion implantation using non-electrically active ions, such as silicon, germanium and fluorine, in order to eliminate channeling. The pre-amorphisation implantation creates in the substrate an amorphous surface layer adjacent to the underlying crystalline semiconductor material and produces a large number of defects beyond the amorphous/crystalline (a/c) interface. These crystal defects are usually called End of Range (EOR) defects. Defects of this kind are known to enhance diffusion of previously implanted dopant ions during subsequent thermal processes of annealing and activation of the semiconductor device. It is also known that during the heat treatment (for annealing and activation), the amorphised layer re-crystallizes and the EOR defects dissolve semiconductor interstitials that effectively migrate towards the surface of the structure, so that they become present in the surface doped layer to provide a mechanism for TED.

TED increases the diffusivity of the dopant in the doped layer with the result that the depth of the shallow doped layer is increased beyond its target depth. With the desire to reduce the size of semiconductor devices, several techniques have been proposed to reduce the effects of TED so as to reduce the depth of the doped layer by reducing the EOR defects.

One such technique provides a layer rich in a trap element located between a surface implanted boron layer, and the EOR defects beyond the amorphous/crystalline (a/c) interface. Then, during heat treatment, migrating defects are essentially halted or trapped by this layer and prevented from migrating up to the surface to provide the TED mechanism in the boron layer. As a result, a junction can be formed in the substrate that is shallower and can have a steeper profile.

In a typical process, a pre-amorphisation implantation of Ge is followed by a carbon (C) implantation to form a trapping layer for preventing interstitial back flow. Fluorine (F) is then implanted to address Negative Bias Temperature Instability (NBTI) or for dopant activation purposes. Then, Nitrogen (N) is implanted to help prevent boron (B) deactivation. Finally, B is implanted into the substrate and activated by a solid phase epitaxy (SPE) anneal.

FIG. 1 illustrates this process and shows the implanted C layer trapping the EOR defects during the post-B implantation anneal.

This conventional method of forming shallow junctions and addressing TED issues associated therewith necessarily involves at least four separate implantation steps (i.e., Ge pre-amorphisation implantation, C implantation, F implantation and N implantation) before the B implantation. This multistep process has time and expense cost penalties. Further, there are penalties associated with the Ge, N, C and F impurities, such as sheet resistance (Rsd) degradation and junction leakage. Moreover, impurities such as N and C have hot carrier and NBTI penalties.

An implantation procedure for forming ultra-shallow doped regions with reduced TED is desired.

SUMMARY OF THE INVENTION

A method of forming ultra-shallow p-type lightly doped drain (LDD) regions of a PMOS transistor in a surface of a substrate includes the steps of providing a gaseous mixture of an inert gas, a boron-containing source, and an optional carbon-containing source, wherein the concentration of the gaseous mixture is at least 99.5% dilute with the inert gas and the optional carbon-containing source, if present, forming the gaseous mixture into a plasma, and forming the LDD regions, wherein the forming step includes plasma-doping the boron into the substrate using the plasma. N-type pocket regions are formed in the substrate underneath and adjacent to the LDD regions, wherein the n-type pocket regions include phosphorous impurities at a dopant concentration of less than $6.0 \times 10^{18}$ atoms/cm$^3$.

A PMOS transistor is also provided. The PMOS transistor includes a gate and gate oxide layer formed over the substrate; a pair of spacers formed adjacent the gate; a pair of shallow p-type lightly doped drain (LDD) regions formed below the spacers in the substrate, wherein the LDD regions are doped with boron; a pair of p-type source/drain regions formed in the substrate adjacent the LDD regions; and a pair of n-type pocket regions underlying the LDD regions and extending into a channel region formed therebetween, wherein for a PMOS transistor having a threshold voltage of 100 mV the n-type pocket regions include phosphorous impurities at a dopant concentration of less than $6.0 \times 10^{18}$ atoms/cm$^3$, or a proportionately lower/higher dopant concentration for a lower/higher threshold voltage The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which:

FIG. 3 is a schematic illustration of a plasma doping apparatus.

DETAILED DESCRIPTION

Figure 1:
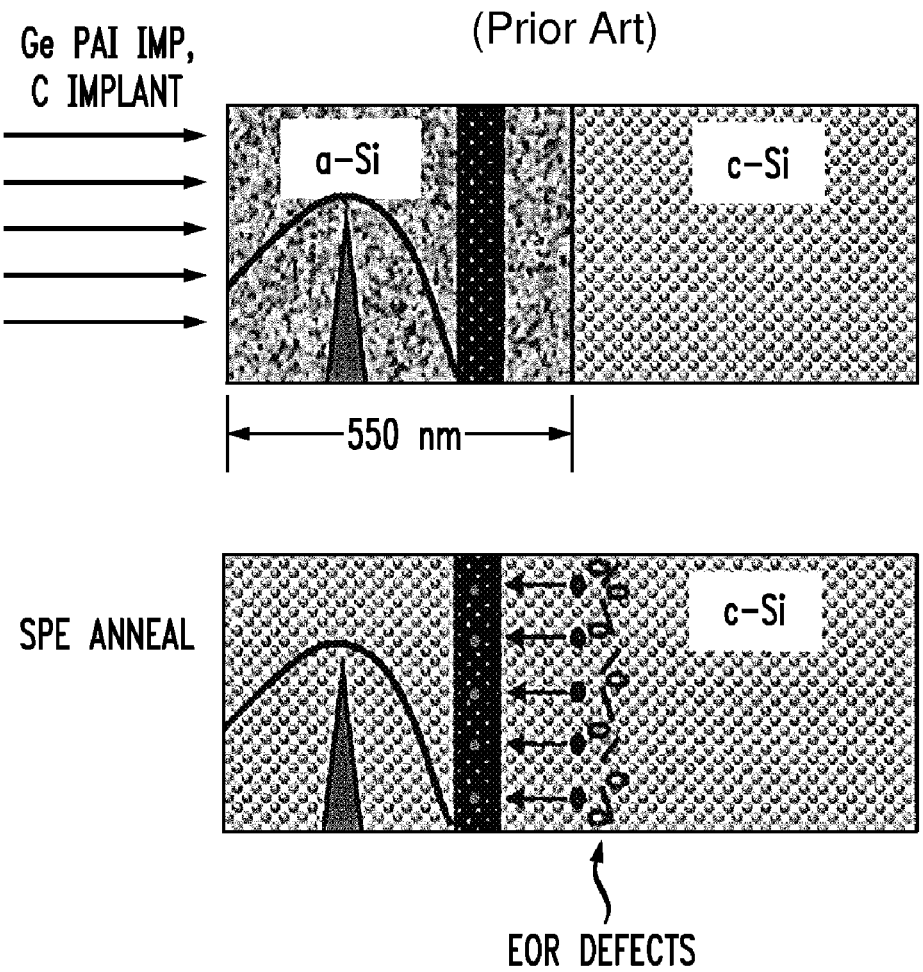
FIG. 1 illustrates a prior art process for addressing EOR defects.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

An improved method of forming ultra-shallow junctions, particularly ultra-shallow PLDD regions for CMOS devices is described below. In embodiments, the method obtains quality ultra-shallow doped regions without the need for separate implantation steps, such as those described in the Background section associated with pre-amorphisation, interstitial trapping and deactivation prevention. The resulting junction is abrupt and the method has no sheet resistance penalty. Boron interstitial clusters (BIC) are reduced, resulting in activation enhancement. Moreover, the junction is very stable, exhibiting resistance to thermally induced deactivation. While the method forms stable, abrupt ultra-shallow junctions, the junctions increase the threshold voltage (Vt) of the device above the desired limits. Therefore, the method also downwardly compensates for this adjustment by reducing the phosphorous dose in the n-type pocket regions underlying the PLDD regions, thereby reducing the threshold voltage to the target level.

Figure 2:
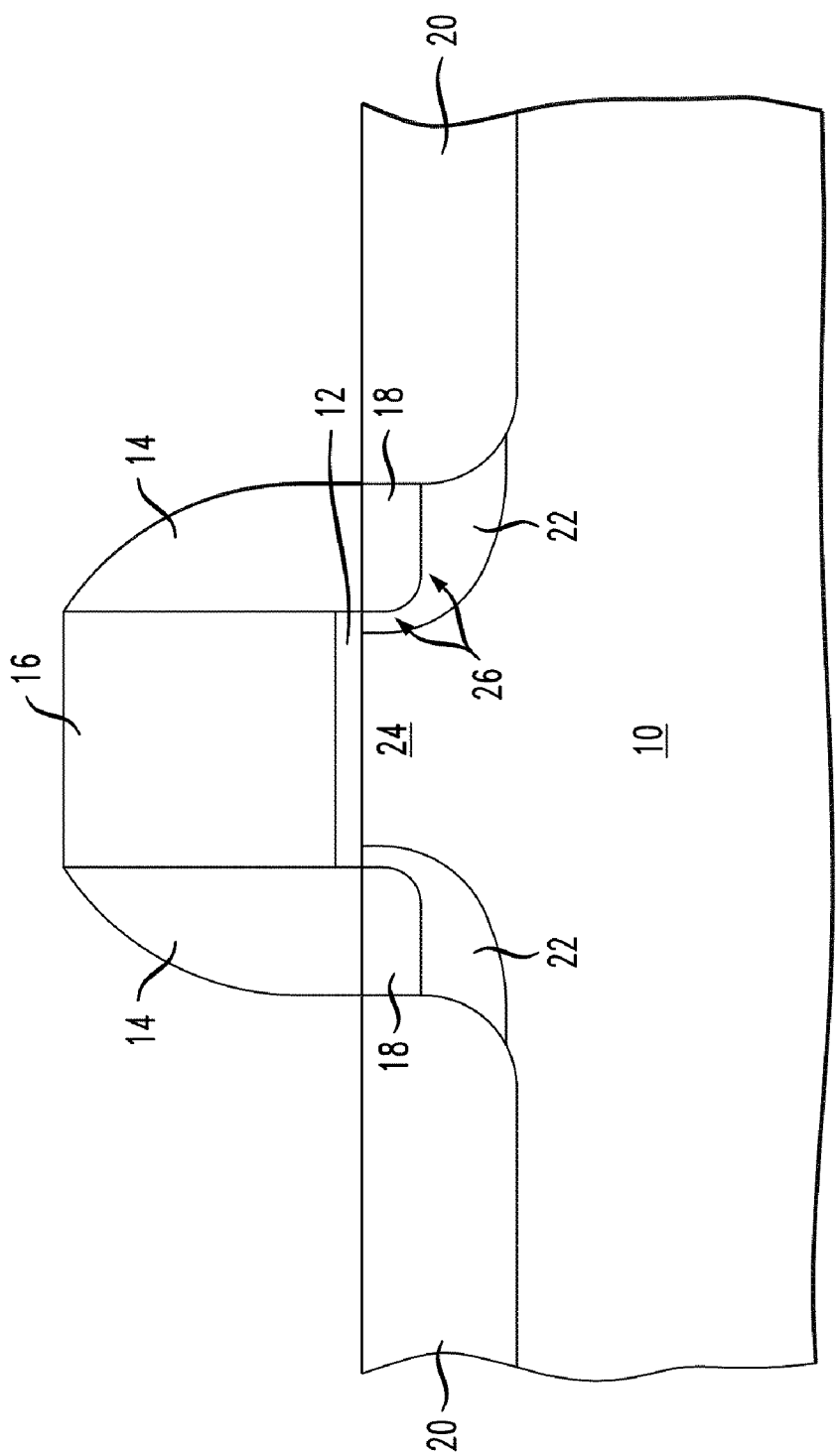
FIG. 2 illustrates a transistor structure according to an embodiment of the present invention.

FIG. 2 illustrates a PMOS transistor according to an embodiment of the present invention. The PMOS transistor is formed in a substrate 10, such as n-doped silicon substrate. A gate oxide layer 12 is formed over the substrate, along with polysilicon gate 16 and side spacers 14. In embodiments, the gate 16 is a metal gate. For some advanced generations, a dummy polysilicon gate is formed, and then removed. A metal gate is formed in the opening left by the removal of the dummy polysilicon gate. Underlying the side spacers 14 are ultra-shallow lightly doped drain (LDD) regions 18, specifically p-type LDD regions. Deeper, more highly-doped source/drain (S/D) regions 20 are formed adjacent the PLDD regions 18. N-type pockets 22 are formed underneath the PLDD regions 18 and adjacent the S/D regions 20, extending into the channel region 24. As will be understood by those familiar with transistor formation, the channel length depend on the technology node/generations. In embodiments, the technology node/generation is 90 nm or less (e.g., 90 nm, 75 nm, 65 nm, 53 nm, 45 nm, 37 nm, 32 nm, 22 nm, etc.).

In the creation of ultra-shallow p-n junctions in CMOS manufacturing, special attention is given to forming PMOS S/D regions. To date, boron is the one candidate for p-type dopant that has a high enough solid solubility to form S/D structures with the required electrical conductivity; however boron will diffuse rapidly in the silicon substrate during the anneal ("activation") cycle that is required to process the wafers. This anomalous boron diffusion, called transient enhanced diffusion (TED), limits the attainable parameters, in particular the abruptness of the p-n junction, particularly that of the PLDD regions. TED is believed to be mediated (detrimentally increased) by defects created in the silicon during the implantation process, as discussed above.

In an exemplary method of forming the ultra-shallow PLDD regions of the transistor, a single boron implantation step is employed for implanting boron impurities into substrate 10 to form ultra-shallow PLDD regions without the need for the Ge pre-amorphisation implantation, C implantation, F implantation and N implantation steps of the prior art. More specifically, plasma doping is performed using a heavily dilute gaseous mixture. In exemplary embodiments, the source material for the boron impurities is $B_nH_m$, preferably diborane ($B_2H_6$). The diborane is heavily diluted with an inert gas, preferably a noble gas, and most preferably helium (He). The $B_2H_6$/He mixture is preferably at least 99.5% dilute before the gaseous mixture is formed into a plasma and the doping process begins. The "dilution" ratio is determined by molar weight. While He is the preferred dilution gas, it is believed that other inert gasses such as Argon, Xenon, etc. may also be used.

While not wanting to be bound by any specific theory of operation, it is believed that using a gaseous mixture with a high He dilution results in slow doping of the boron impurities into the substrate and fast amorphisation of the silicon substrate, which retards boron dopant diffusion. This approach provides a uniquely abrupt (i.e., box like) dopant profile. That is, as pointed to generally by reference number 26 in FIG. 2, the PLDD region has a steep end edge and abrupt transition between this edge and its bottom edge. The He concentration is self-limited by the target dopant dose for the boron (usually around about $7 \times 10^{14}$ atoms/cm$^2$) but, in the typical PLDD recipe dose, the corresponding He dosage is high enough (e.g., $>3 \times 10^{20}$ atoms/cm$^3$) to form He-divacancy clusters. Distribution of these He-divacancy clusters across the entire dopant profile reduces unwanted boron interstitial clusters and increases resistance to dopant deactivation. The resultant junction is very stable, i.e., highly resistant to thermal induced deactivation. Advantageously, the method allows for strict control over the junction abruptness by control over a process parameter, i.e., He dilution levels of the gaseous mixture used in forming the plasma used in the implant procedure.

Optionally, in embodiments, the gaseous mixture used in the plasma doping step may also include a carbon source, such as $CH_4$ for co-doping the substrate with C. The $CH_4$ carbon source can be provided as part of the pre-mix (shown in FIG. 3) or as a separate source. In embodiments, the target does for the C is between about $1 \times 10^{14}$ to $1 \times 10^{15}$ atoms/cm$^2$. When the implant energy is lower than 2 keV, the He may out diffuse from the wafer. Since He-divacancy cluster formation requires sufficient He concentration, in the region near the surface junction (5-10 nm) the He concentration may not be high enough. Co-implanting C can assist the He in forming trapping interstitials. In this embodiment, the mole ratio of the $CH_4$ carbon source and the $B_2H_6$ Boron source is preferably 1:1. In embodiments, the gaseous mixture includes: He/$B_2H_6$/$CH_4$:99%/0.5%/0.5%, or He/$B_2H_6$/$CH_4$:99.2%/0.4%/0.4%.

By way of example only, a detailed description of a plasma implantation process and device are described in U.S. Pat. No. 7,348,264, the entirety of which is hereby incorporated by reference herein.

FIG. 3 is a schematic illustration of a plasma doping/implantation apparatus 100 for use the B/He implantation process discuss above. The apparatus 100 includes a source 110 of a gaseous $B_2H_6$/He pre-mix. The pre-mix has a dilution that is less than the target 99.5% minimum dilution, such as 99%. A separate source 120 of He is provided to allow for further dilution of the $B_2H_6$/He pre-mix at node 130. The apparatus 100 includes a reaction chamber 140, in which a target wafer 150 is placed. A gas control sensor (GCS) 160 monitors the constituent level of the gas flowing into it to determine the dilution level. The GCS 160 provides feedback signals (illustrated by dashed lines labeled "CIP" for continuous improvement program in FIG. 3) for controlling the release of He from He source 120 and/or the release of the $B_2H_6$/He pre-mix from premix source 110, such as through respective mass flow controllers (MFC), so that the dilution level reaches at least 99.5%. The GCS 160 should have a detection accuracy of at least 0.1%, as the junction profile is very sensitive to the dilution level. Once the dilution level reaches at least 99.5%, the $B_2H6$/He gaseous mixture is released to the reaction chamber 140. Alternatively, the GCS can control the separate release of He and the $B_2H6$/He pre-mix directly into the chamber 140 and monitor the levels in the chamber such that the desired dilution is reached in the chamber.

Other features of the plasma doping apparatus are not shown in FIG. 3 but will be familiar to those in this art. For example, a degree of vacuum in the reaction chamber 140 is controlled by pressure regulating valve(s), mass flow controller(s), turbo molecular or dry pumps, or other devices and combinations thereof. Also, a coil, antenna or other device can serve as a plasma source provided in the vicinity of a dielectric window facing a lower electrode. A high-frequency power supply for supplying high-frequency power to the coil or antenna, and a high-frequency power supply serving as a voltage source for the lower electrode are provided. The substrate 150 is placed on the lower electrode, which serves as a sample table, and plasma irradiation is performed onto the substrate.

As will be familiar to those in the art of plasma doping, the gaseous mixture is formed into a plasma and the boron impurities are doped into the substrate 150. The mixture is introduced from the gas supply into the reaction chamber 140 of the process chamber, while any needed gas exhaust is performed by an exhaust device. The reaction chamber 140 is kept at a predetermined pressure. Then, high-frequency power is supplied from the high-frequency power supply to the coil, antenna or other device as a plasma source, such that inductively coupled plasma is generated in the reaction chamber 140. The potential of the lower electrode can be controlled such that the silicon substrate 150 has a negative potential with respect to plasma.

In embodiments, the pressure in the reaction chamber is maintained between about 5-10 mTorr. Two power sources may be used, the top one of which is used in plasma formation and the bottom one of which is for wafer bias to define the implanted ion energy. High-frequency power (e.g., about 100-300 W at about 2 to 13.56 MHz) is supplied to the coil, antenna or other element as a plasma source so as to generate plasma in the reaction chamber. High-frequency power (e.g., RF bias at 13.56 MHz or a pulsed DC bias) is supplied to the lower electrode such that boron is implanted in the vicinity of the surface of the silicon substrate 150. The duty cycle for the pulsed DC bias is preferably high (e.g., 40-50%), and preferably approximately 1:1. Depending on the recipe energy and dose parameters, implantation takes between about 60-200 seconds.

The boron implantation is followed by a rapid thermal anneal step that activates the boron impurities. This thermal step also serves to drive the He impurities from the substrate that are implanted into the substrate along with the boron. Since He is extremely light (e.g., has a small mass), the He can be diffused out of the substrate quickly by a rapid thermal anneal process (e.g., RTP spike>900° C. for 1.5 seconds, or millisecond anneal at >1100° C.).

While the PLDD formation method described above forms stable, abrupt ultra-shallow junctions, it has been observed that these junctions result in an increase of almost two times in the threshold voltage (Vt) of the PMOS device above the target limits. This increase in threshold voltage reduces headroom (Vdd−Vt) for a fixed power supply voltage (Vdd), which degrades current drive. The dopant concentration within the channel region is mainly contributed by the pocket implant regions 22. Therefore, lowering the pocket dopant concentrations can lead to lower threshold voltages. As such, the improved method also compensates for this increase in threshold voltage by reducing the concentration of the n-type dopants of the pocket regions 22. The dopant species for the n-type pocket regions 22 is preferably phosphorous. While the pocket regions 22 may also include other n-type impurities, such as arsenic, lowering the phosphorous concentration in the pocket regions 22 is most effective in controlling the threshold voltage of the device. In addition to downwardly adjusting the threshold voltage to a selected target, lowering the implant dosage of phosphorous in the pocket regions 22 reduces impurity and defects density in the channel and thus reduces carrier scattering. Reduced carrier scattering has the advantageous result of boosting current drive (Idsat, Idlin). The improved current drive (Idsat, Idlin) achieved by this method, when compared to a PMOS device formed using ion implantation, was confirmed for a PMOS device having a gate length of about 40 nm, an as-implanted junction depth of about 9 nm and a dopant concentration of $1\times10^{21}$ atoms/cm$^3$. Improvements of 6% or more were observed.

For example, for a transistor having a channel length of 40 nm, and PLDD regions of about 9 nm and a dopant concentration of $1\times10^{21}$ atoms/cm$^3$ formed using the method described above, and having a target threshold voltage of 100 mV, the phosphorous dopant concentration in pocket regions 22 is reduced about 42% from $6.0\times10^{18}$ atoms/cm$^3$ as would be called for by conventional wisdom to be less than or equal to about $3.5\times10^{18}$ atoms/cm$^3$ pocket dose. This corresponds to an implant dosage change from $3.8\times10^{13}$ atoms/cm$^2$ to $2.2\times10^{13}$ atoms/cm$^2$. In embodiments, the dopant concentration can be less than or equal to $3.0\times10^{18}$ atoms/cm$^3$. Without this reduction in pocket dose, the threshold voltage Vt would be 200 mV.

For phosphorous dopant concentrations between $1.0\times10^{18}$ and $1.0\times10^{19}$ atoms/cm$^3$, the relationship between phosphorous implant dose and Vt should be generally linear. Therefore, based on these teachings, one of ordinary skill in the art can adjust the phosphorous implant dose to achieve proportionately lower or higher desired threshold voltage Vt. It is expected that the Vt range that will be characterized by similar advantages (in reduction of phosphorous implant dose and resulting reductions in defect density and carrier scattering) would have source to drain off current (Isoff) in the range of about 1-100 nA/µm.

In embodiments, a method of forming ultra-shallow p-type lightly doped drain (LDD) regions in a surface of a substrate for PMOS transistors includes: providing a gaseous mixture which includes a boron-containing source and a dilute gas (e.g., an inert gas with an optional carbon-containing source), wherein the concentration of the dilute gas in the gaseous mixture is at least 99.5; forming the gaseous mixture into a plasma; forming the LDD regions, wherein the forming step includes plasma-doping the boron into the substrate using the plasma; and forming n-type pocket regions in the substrate, the n-type pocket positioned underneath and adjacent to the LDD regions, wherein the n-type pocket regions include phosphorous impurities at a dopant concentration of less than $1.0\times10^{19}$ atoms/cm$^3$.

It should be understood that based on this guidance other devices, e.g., devices with LDD junctions depths from about 15 nm to 7 nm and dopant concentrations between about $1.0\times10^{20}$ atoms/cm$^3$ to $1.0\times10^{21}$ atoms/cm$^3$, should enjoy similar advantages related to the abrupt junctions that can be formed using plasma doping and improved pocket regions.

As an alternative to reducing the pocket dose in order to reduce the threshold voltage of the transistor to a target level, the work function of the PMOS transistor can be increased or decreased to reach the target threshold voltage. For example, the work function could be increased 100 meV from a range of 4.65 eV to 5.2 eV to a range of 4.75 eV to 5.3 eV in order to decrease the threshold voltage from about 200 mV to about 100 mV. As the work function is inversely proportional to threshold voltage, it should be understood that the work function could be increased/decreased proportionately for decreases/increases to the targeted threshold voltage. Moreover, combinations of modifications to the pocket implant dosage and to the work function are also contemplated and may be made by those of ordinary skill in the art based on the teachings of this disclosure.

As described above, the improved method of forming PLDD regions of PMOS transistors in substrates provides a simple (when compared to multi-step approaches of the prior art) method of controlling p-type dopant region depth and contour. The resultant dopant region is controllable, stable and abrupt (i.e., more box-like than tailing). The method exhibits dopant activation enhancement and dopant diffusion suppression.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming ultra-shallow p-type lightly doped drain (LDD) regions in a surface of a substrate for PMOS transistors comprising:
   providing a gaseous mixture of an inert gas, a boron-containing source, and a carbon-containing source, wherein the concentration of the gaseous mixture is at least 99.5% dilute with the inert gas and the carbon-containing source;
   forming the gaseous mixture into a plasma;
   forming the LDD regions, wherein the forming step includes plasma-doping the boron into the substrate using the plasma; and
   forming n-type pocket regions in the substrate, each n-type pocket region positioned underneath and adjacent to a respective LDD region,
   wherein the carbon-containing source is $CH_4$ and the boron-containing source is $B_2H_6$, and wherein the carbon-containing source and boron-containing source are provided in substantially equal concentrations and the gaseous mixture is between about 99.0-99.2% dilute with the inert gas.

2. The method of claim 1, wherein before forming the gaseous mixture into a plasma, the gaseous mixture is dilute with a first amount of the inert gas, the method further comprising the steps of:
   monitoring the concentration of the gaseous mixture; and
   adding the inert gas to the gaseous mixture to dilute the gaseous mixture to at least 99.0-99.2% dilute with the inert gas.

3. The method of claim 2, wherein the step of forming the gaseous mixture into a plasma comprises the step of releasing the gaseous mixture into a reaction chamber containing the substrate after the concentration of the gaseous mixture is at least 99.5% dilute with the inert gas and carbon-containing source.

4. The method of claim 1, wherein the inert gas is helium.

5. The method of claim 1, wherein for a PMOS transistor having a threshold voltage of 100 mV, the n-type pocket regions include phosphorous impurities at a dopant concentration of less than or equal to about $3.5 \times 10^{18}$ atoms/cm$^3$, or a proportionately lower/higher dopant concentration for a lower/higher threshold voltage than 100 mV.

6. The method of claim 1, wherein the substrate is a silicon substrate.

7. The method of claim 1, further comprising the step of, after forming the LDD regions, forming spacers adjacent a gate structure and implanting source/drain regions into the substrate adjacent the LDD regions.

8. The method of claim 1, wherein the LDD regions have a boron dopant concentration of about $1.0 \times 10^{20}$ atoms/cm$^3$ to $1.0 \times 10^{21}$ atoms/cm$^3$ formed to an implanted depth of about 7-15 nm.

9. The method of claim 1, wherein the n-type pocket regions further include arsenic impurities doped therein.

10. A method of forming ultra-shallow p-type lightly doped drain (LDD) regions in a surface of a substrate for PMOS transistors comprising the steps of:
   providing a gaseous mixture, comprising a boron-containing source and a dilute gas, wherein the concentration of the dilute gas in the gaseous mixture is at least 99.5%;
   forming the gaseous mixture into a plasma;
   forming the LDD regions, wherein the forming step includes plasma-doping the boron into the substrate using the plasma; and
   forming n-type pocket regions in the substrate, each n-type pocket region positioned underneath and adjacent to a respective LDD region, wherein the n-type pocket regions include phosphorous impurities at a dopant concentration of less than $1.0 \times 10^{19}$ atoms/cm$^3$,
   wherein the dilute gas comprises an inert gas and a carbon-containing source, wherein the carbon-containing source and boron-containing source are provided in substantially equal concentrations and the gaseous mixture is between about 99.0-99.2% dilute with the inert gas.

11. The method of claim 10, wherein the the n-type pocket regions include phosphorous impurities at a dopant concentration of less than $6.0 \times 10^{18}$ atoms/cm$^3$.

12. The method of claim 10, wherein the n-type pocket regions include phosphorous impurities at a dopant concentration of less than $3.0 \times 10^{18}$ atoms/cm$^3$.

13. A method of forming ultra-shallow p-type lightly doped drain (LDD) regions in a surface of a substrate for PMOS transistors comprising:
   providing a gaseous mixture of an inert gas, a boron-containing source, and a carbon-containing source, wherein the concentration of the gaseous mixture is at least 99.5% dilute with the inert gas and the carbon-containing source;
   forming the gaseous mixture into a plasma;
   forming the LDD regions, wherein the forming step includes plasma-doping the boron into the substrate using the plasma, wherein the LDD regions have a boron dopant concentration of about $1.0 \times 10^{20}$ atoms/cm$^3$ to $1.0 \times 10^{21}$ atoms/cm$^3$ formed to an implanted depth of about 7-15 nm; and
   forming n-type pocket regions in the substrate, each n-type pocket region positioned underneath and adjacent to a respective LDD region,
   wherein for a PMOS transistor having a threshold voltage of 100 mV, the n-type pocket regions include phosphorous impurities at a dopant concentration of less than $3.5 \times 10^{18}$ atoms/cm$^3$, or a proportionately lower/higher dopant concentration for a lower/higher threshold voltage than 100 mV,
   wherein the carbon-containing source is $CH_4$ and the boron-containing source is $B_2H_6$, and wherein the carbon-containing source and boron-containing source are provided in substantially equal concentrations and the gaseous mixture is between about 99.0-99.2% dilute with the inert gas.

14. The method of claim 1, wherein for a PMOS transistor having a threshold voltage of 100 mV, the n-type pocket regions include phosphorous impurities at a dopant concentration of less than $6.0 \times 10^{18}$ atoms/cm$^3$, or a proportionately lower/higher dopant concentration for a lower/higher threshold voltage than 100 mV.

* * * * *